United States Patent [19]

Torma et al.

[11] 4,178,562

[45] Dec. 11, 1979

[54] CAVITY RESONATORS WITH FREQUENCY-LINEAR TUNING

[75] Inventors: Imre Torma; Maria Temesi nee Palmai; Sándor Földes; József Dorogi, all of Budapest, Hungary

[73] Assignee: Tavközlési Kutató Intézet, Budapest, Hungary

[21] Appl. No.: 757,868

[22] Filed: Jan. 10, 1977

[51] Int. Cl.[2] .......................... H03B 9/06; H01P 7/04; H01P 7/06

[52] U.S. Cl. ........................................ 331/84; 331/96; 333/226; 333/229; 333/232; 333/234

[58] Field of Search .............. 333/82 B, 82 BT, 83 R, 333/83 T; 331/97, 101, 84, 96

[56] References Cited

U.S. PATENT DOCUMENTS

| | | | |
|---|---|---|---|
| 2,666,904 | 1/1954 | Johnson | 333/83 R |
| 2,750,568 | 6/1956 | Gardner | 333/82 B |
| 2,905,011 | 9/1959 | Armstrong et al. | 333/82 B X |
| 2,922,957 | 1/1960 | Haszard | 333/82 B X |

*Primary Examiner*—Paul L. Gensler

[57] ABSTRACT

Cavity resonators, preferably thermocompensated, with a straight-line frequency tuning, tuning elements of which move along a straight-line forced trajectory, and microwave circuits that contain such cavity resonators. At least one tuning element is connected to the cavity, made up of structural elements that are displaceable along a forced trajectory when the elements are in a forced coupling with a straight guide path formed on the structural element. The latter can be swung around an axis which is perpendicular to the direction of movement of the tuning element, the latter being provided with a roller that bears against the guide path. The cavity resonators are furthermore provided with frequency-linear adjusting members that can be displaced along the straight forced trajectory on the latter, also provided with a roller which bears against the guide path that is in a forced coupling with the structural element.

22 Claims, 3 Drawing Figures

CAVITY RESONATORS WITH FREQUENCY-LINEAR TUNING

Figure 1:
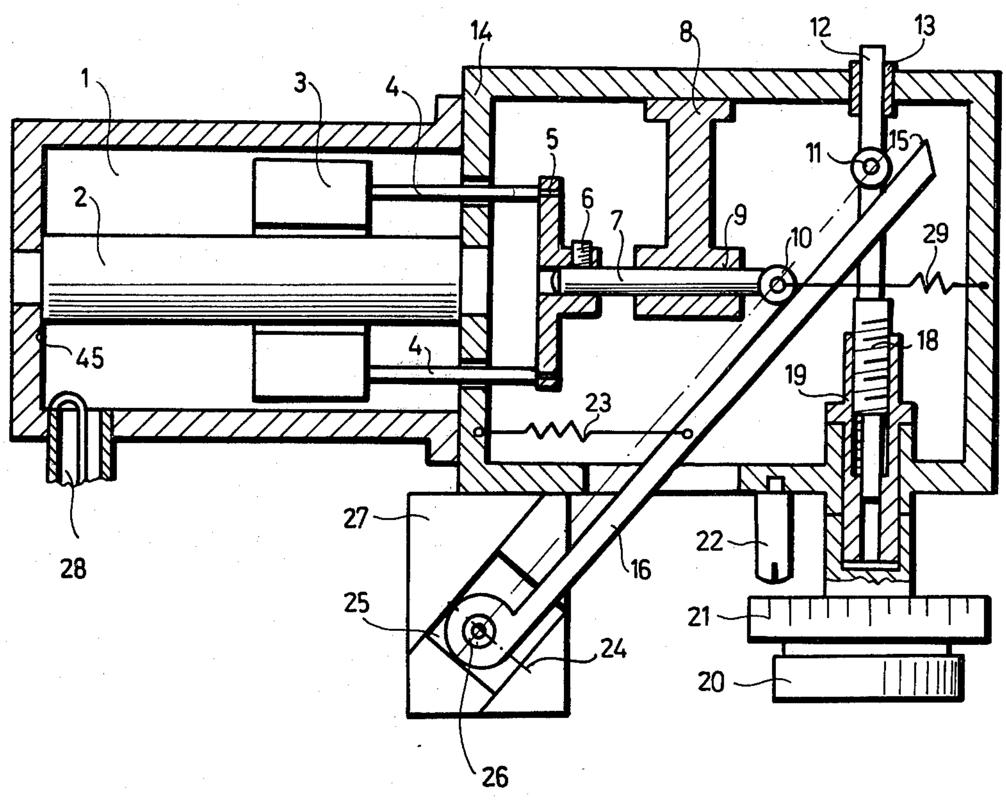

The invention relates to a—preferably thermocompensated—cavity resonator with a straight-line frequency tuning, the tuning element of which moves along a straight-line forced trajectory, as well as to a microwave circuit containing one or more cavity resonators or those tuned by the resonators, such as especially a signal generator, a measuring oscillator, a frequency meter and a measuring-receiving microwave-circuit.

The cavity resonator according to the invention consists of a cavity, a tuning unit and of individually adjustable, known complementary elements, for instance a coupling loop, an iris, a reflex klystron, semi-conductors, etc., as well as of units ensuring power feeding and control functions.

With tunable cavity resonators and circuits having cavity resonators—as a characteristic example for which resonant frequency meters, measuring oscillators tuned by a cavity resonator, signal generators and receivers can be mentioned the under mentioned are known solutions used for tuning:

In case of a non-linear tuning, tuning takes place as a function of the resonant frequency, by the aid of a driving structural element of non-linear displacement, whereby frequency reading is performed indirectly, by using a calibration diagram, or by a non-linear scale calibrated in a direct frequency. With circuits having several cavity resonators, when using this type of tuning, there is either a separate driving element for each resonator, to be adjusted individually, or a common drive is used for each resonator, and suitable arrangements are used for compensating the differences between the characteristics of the single resonators.

In a rather simple solution straight-line frequency tuning is performed by the aid of a generatrix in which the tuning element of the cavity resonator is actuated by an eccentric-like construction, the generatrix radius of which changes in accordance with the non-linear tuning rule of the cavity; an adjustable embodiment of the generatrix is also known.

With the helical tuning method, which can be considered as a more developed variant of the tuning by the aid of the generatrix, the latter is replaced by a spiral with a non-linear pitch, fixed onto a cylinder jacket.

For realizing the frequency-linear tuning a construction with a rod mechanism is also known, approximating the non-linear tuning characteristics of the cavity resonator by a circular arc.

Approximately linear tuning may be achieved electrically by the simultaneous tuning of the waveform components of several waveform spaces shaped within the cavity resonator.

Frequency meters are further known in which the displacement of the inner conductor of the cavity causes a change in both the TEM and the TM components of the electromagnetic field of the cavity.

In respect to thermocompensation, that is to reduction in resonant frequency change due to the change in temperature, the undermentioned solutions are known:

With cavity resonators and circuits, respectively, where the relative frequency accuracy does not surpass $10^{-3}$ (=0.1%), no solutions are applied for reducing thermosensitivity.

In case the frequency accuracy surpasses $10^{-3}$, the cavity resonator—and in some embodiments the tuning element—is (are) made of materials with a low temperature factor, f.i. Invar, or the cavity resonator and the tuning element are made of materials having different thermal expansions.

The drawbacks of the known solutions can be summarized as follows: Among the methods with a non-linear tuning the variant with indirect reading is considered as an outworn method due to the wearisome application. The types applying a direct reading are either made with an individual calibration involving high expenses, or the deviations resulting from the manufacture of cavity resonators and the circuit-elements located therein, or coupled to it, cannot be subsequently corrected, thus deteriorating the accuracy of the calibration.

In case of circuits containing several resonators, adjustment of the separate tuning elements becomes difficult, whereas labor-intensive constructions serving for compensation can be produced only with difficulty.

Straight line tuning of the generatrix system has been simple in respect of construction, but at the same time the production of the generatrix requires a special technology, which—besides being expensive—is less accurate than other technologies requiring simple rotating or progressive movements. The calibration errors due to deviations in dimensions that occur during production cannot be corrected with this solution either.

The solutions applying an adjustable generatrix and spirals enable subsequent corrections but at the expense of a more complicated, consequently more expensive structure.

In order to achieve accuracy, labor-intensive adjustment at several points is imperative. In the course of the adjustments a deformation of the materials occurs, reducing the stability of the adjustments.

By using the tuning method, by applying a rod mechanism, an approximate linearisation may be achieved where the error cannot be reduced below a value corresponding to the difference between the circular characteristics realized by the tuning rule of the cavity resonator and the rod mechanism.

Simultaneous tuning of several waveforms necessitates a forming of the cavity resonator, which is disadvantageous in respect of the quality factor of the cavity resonator, consequently the attainable accuracy is also restricted. The even theoretically approximative nature of the realized tuning can be considered as a further restriction of accuracy.

The drawbacks of the solutions applied for the reduction of temperature errors are as follows: The drawbacks of the solutions using materials with a low temperature factor lies in that these special materials (Invar, Superinvar) are expensive, processing costs being also very high, simultaneously their temperature factor does not equal zero. On the other hand there is a significant deviation resulting from manufacturing. The mentioned fact appears in the temperature factor of the cavity resonators made of such materials and the circuits containing such cavity resonators.

The drawback of the known thermocompensating solutions lies in that compensation takes place only at a single point of the cavity and the circuit tuning ranges, respectively, their approximate effectiveness being restricted to a rather insignificant frequency range.

The aim of this invention is to produce a cavity resonator, i.e. a circuit tuned by a cavity resonator, by the aid of which accuracy limits can be improved, and labor intensitivity can be significantly reduced.

To achieve this by the use of the inventive cavity resonator and the circuit tuned by such a resonator, the following characteristics are being realized:

To reduce the characteristics modification resulting from the deviation of the cavity resonator and the coupled circuit elements to an extent, where only a few adjusting elements are contained.

Instead of the linearization having a predetermined approximative character, a linearization is to be used that strictly follows the basic waveform of the cavity resonator. (Here and henceforth an operational field-strength distribution within the cavity resonator is meant under basic waveform which plays a significant role in forming the tuning characteristics of the cavity resonator.)

The essence of the novel, preferably thermocompensated, cavity resonator with a straight-line frequency tuning, a tuning element of which moves along a straight-line forced trajectory, and of the novel microwave-circuit containing one or more cavity resonators or tuned by such resonators, both according to the invention, and basically operating in a TEM waveform, lies in that the tuning element(s) is (are) connected to the cavity, and are composed of structural elements—preferably of spacers and piston(s)—that ensure straight guidance and are displaceable along a forced trajectory. These elements are in a forced coupling with the straight guide path formed on the structural element, rotatable around an axis that is perpendicular to the direction of movement of the tuning element, or with the straight guide path being in a forced coupling with the structural element.

For TE and TM modifications an axial displacement is made possible so that the tuning element is provided with a roller that bears against the guide path, preferably prestressed by a spring.

The inventive cavity resonator is provided with a frequency-linear adjusting organ, preferably a rod, displaceable along the straight forced trajectory and provided with a roller. The latter bears—with the embodiment for the basic TEM waveform—against the guide path formed on the structural element, preferably prestressed by a spring, or against the guide path that is in a forced coupling with the structural element.

In the modification with the TE and TM basic waveform the roller on the adjusting organ bears against another straight-line guide path, preferably perpendicular to the direction of movement of the tuning element, and formed on a holder fixed to a wall of the cavity resonator.

In a preferred solution according to the invention the centre of the axle of the structural element, the centre of rotation of the roller of the tuning element, and the centre of rotation of the roller of the adjusting organ may lie on the same straight line that is parallel with the guide path.

The direction of movement of the adjusting organ, f.i. of the rod, may include a right angle (or an angle smaller than a right angle) with the direction of straight movement of the tuning element.

The frequency-linear adjusting organ may be provided with a threaded spindle and a corresponding threaded sleeve, whereas a turn knob and a frequency scale (preferably consisting of number indicating discs) are connected to the sleeve or the spindle, preferably through a spacer.

With a preferred embodiment according to the invention the centre of rotation of the roller mounted onto the tuning element is so formed as to be adjustable to a straight direction of movement in relation to the position of a tuning piston in the cavity.

The axle of the structural element is preferably embedded in a holder, the position of which can be adjusted—in relation to the cavity—in a plane that is parallel with a plane defined by directions of straight movement of the tuning element and of the adjusting organ.

The centre of rotation of the roller on the adjusting organ may be adjusted in relation to an operating rod.

In another, modified embodiment of the cavity resonator according to the invention (basic waveforms TE and TM), the direction of the other guide path, fixed to the cavity and forming a support of the roller of the adjusting organ, is perpendicular to the direction of straight movement of the tuning element.

The resultant thermal expansion of components that define a distance between the centre of rotation of the structural element and the end plate of a cavity and/or the electromagnetic cover plane of the cavity, measured in a direction of the straight forced trajectory of the tuning element, equals the resultant thermal expansion of the tuning element.

Furthermore, the resultant coefficient of thermal expansion of the adjusting organ equals the sum of the resultant coefficients of thermal expansion of other components that define two distances, one of which is a distance between the axle of rotation of the structural element and the straight line parallel with the forced trajectory of the tuning element, passing through the centre of rotation of the roller fixed to the tuning element, measured perpendicularly; the other distance being between the axle of rotation of the structural element and the straight line that is parallel with the forced trajectory of the adjusting organ and passing across the centre of rotation of the roller mounted onto the adjusting organ, also measured perpendicularly.

The resultant thermal expansion of the components that define the distance between the centre of the axle of rotation of the structural element and the end plate of the cavity, measured along the straight forced trajectory of the tuning element, equals the resultant thermal expansion of the tuning element.

Furthermore, the coefficient of thermal expansion of the cavity equals the resultant coefficient of the other components defining the dimensions that determine the distance—again measured perpendicularly—between the axle of rotation of the structural element and the straight line, parallel with the forced trajectory of the tuning element and passing across the centre of rotation of the roll that is mounted on the tuning element.

Furthermore the resultant coefficient of thermal expansion of further components defining a further distance between the axle of rotation of the structural element and that of the roller mounted on the adjusting organ equals the coefficient of the cavity and the resultant coefficient of yet other components defining a dimension that is equal to a distance between the straight line perpendicular to the forced trajectory of the tuning element and passing across the axle of rotation of a structural element, and the straight line perpendicular to the forced trajectory of the tuning element and passing across the axle of rotation of the roller mounted on the adjusting organ.

The deviation in dimensions at the cavity resonator and the tuning structural elements—originating from the manufacturing process—are compensated such that the position of the tuning element and of the frequency-linear adjusting organ in relation to the guide path, as well as the position of the axle of rotation of the structural element in relation to the cavity, are adjustable; by the aid of these three adjusting organs zero frequency error can be adjusted at three different points of the frequency characteristics.

As a consequence of the exact linear transformation, in case of such an adjustment, the frequency error due to the transformation will be equal to zero over the whole operational frequency band of the cavity resonator when operating with a pure basic waveform.

Connecting a semi-conductor of negative resistance—f.i. a Gunn diode, an IMPATT diode, a Baritt diode—between the outer and the inner conductor of the cavity resonator according to the invention, operating with a TEM basic waveform, a frequency-linearly tuned measuring oscillator or a signal generator can be formed. In this case the range of the adjusting element has to be increased to an extent that enables the compensation of the reactance effect of the semiconductor exerted on the frequency characteristic of the generator. Instead of a semiconductor an electron tube—f.i. a reflex klystron—can be used to constitute the measuring oscillator or signal generator.

The structural elements for the solutions for the TEM, TE or TM waveforms according to the invention can be easily and accurately prepared since they have a straight geometrical form or they are shaped from cylindrical or threaded profiles. Thus the technological difficulties occurring while preparing structural elements of special forms, as used with the previously described earlier solutions, do not appear.

Owing to its exact linear properties in respect of the basic waveform, the frequency accuracy is not restricted by its own theoretical approximation error.

In the cavity resonator and the circuit, respectively, tuned in accordance with this invention, errors are produced only by additional reactances, f.i. the reactance of the semiconductors or electron valves that are built into the cavity resonator or coupled to the same. At the same time the adjusting elements that are applied for the compensation of manufacturing deviations also serve for performing that approximation.

For compensating the deviations originating from manufacturing, as well as for the optimal approximation of the additional reactances, if any, a few adjusting elements are used; as a consequence the earlier encountered labor intensity of adjusting the tuning characteristics is reduced.

In case of a replacement of the active element (semiconductor or electron valve) used in the cavity resonator, readjustment of the frequency characteristic can be performed with the original accuracy and requiring only a trifle labor intensity.

A further advantage of the solution according to the invention lies in that linearity-control thermocompensation—being independent of frequency—also becomes possible, contrasting with other known solutions where thermocompensation only takes place at a single frequency.

Figure 2:
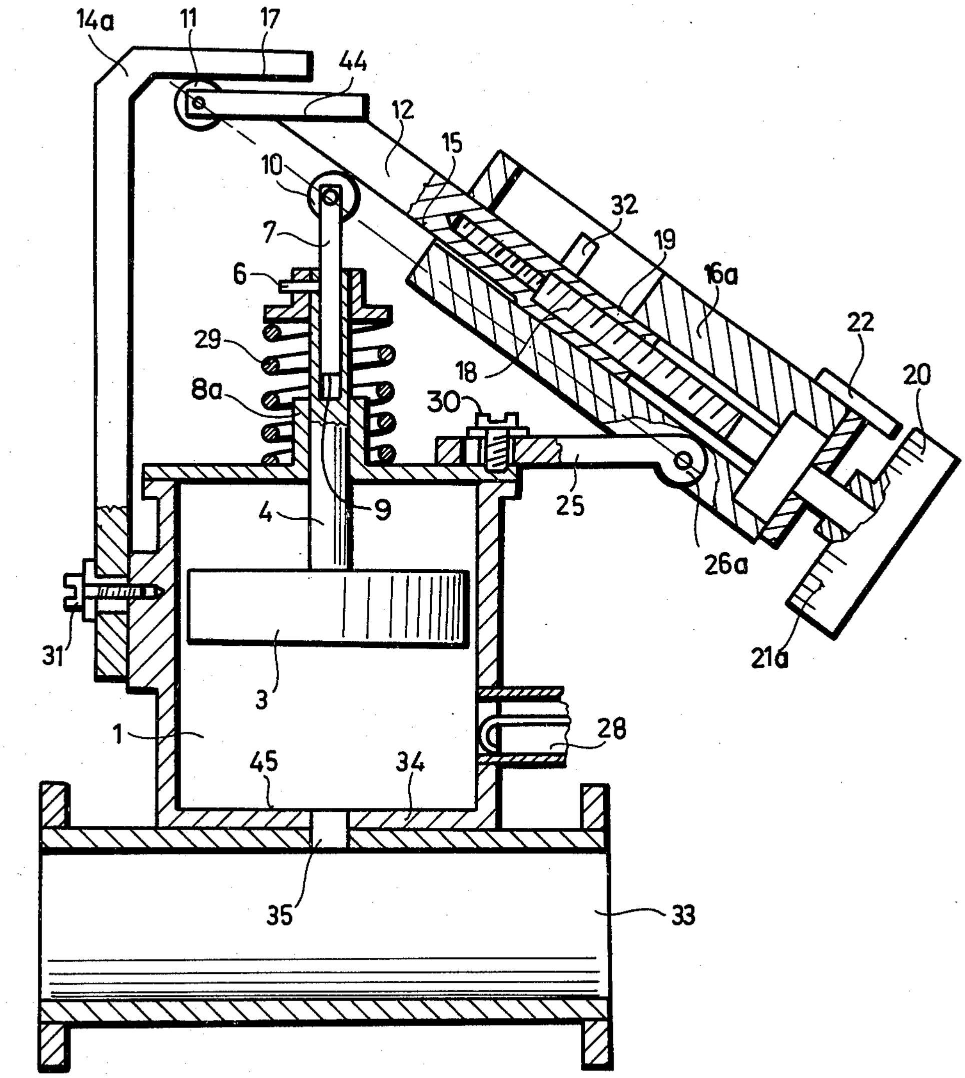
Figure 3:
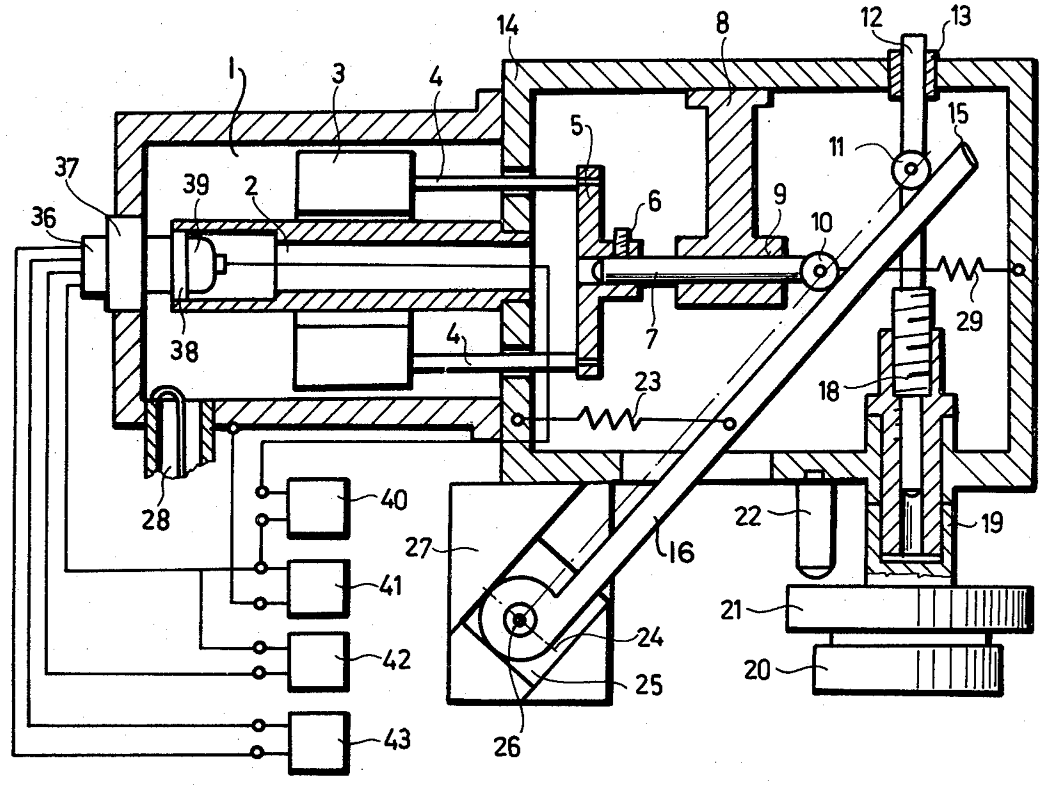

The invention is described in detail by reference to preferred embodiments, with reference to the accompanying drawings, wherein FIG. 1 is a sectional view of an exemplary, preferred cavity resonator according to the invention, operating with a TEM basic waveform;

FIG. 2 is a longitudinal section of another cavity resonator, operating with a TE or TM waveform; and FIG. 3 shows a longitudinal section, similar to that of FIG. 1, of an oscillator built up with a reflex klystron as an active circuit element, serving for the excitation of the oscillation, operating with the TEM basic waveform according to the invention.

A cavity resonator according to the invention, functioning with a TEM basic waveform, is shown in FIG. 1 which illustrates a cavity 1, an inner conductor 2 of the same and a tuning element, preferably formed as a not-contacting piston 3. A spacer—consisting of rods 4, 7 and a holder 8 connecting the same—is fixed to the piston 3. The displacement of the latter is forced onto a path that is parallel with the longitudinal axis of the cavity 1 by a straight path 9 formed on holder 8. The displacement of the piston 3 on that path is realized by an arrangement according to which a roller 10 fixed to the rod 7 rolls along a structural element 16, along a guide path 15, formed in a plane that is perpendicular to that of the drawing.

At the same time a roller 11 fixed onto a rod 12 also rolls along the guide path 15. The forced coupling between the rollers 10, 11 and the guide path 15 is ensured by optional tension springs 23, 29 so that the driving moment that results from the pulling force of the spring 23 and is exerted onto an axle or a rotational shaft 26 of the element 16 (the shaft) being perpendicular to the plane of the drawing) is always higher than a moment of opposite sense that results from the pull force of the spring 29.

The roller 11 and the rod 12 connected to the same move along a straight path defined by a bushing 13 and a threaded sleeve 19, being in a forced coupling with the guide path 15 of the structural element 16.

The straight path of the rod 12 includes an angle of inclination of 90° with the path 15 of the tuning element 16. Angular values between 30° and 90° are useful to give equally good results (any angular value differing from n. 180° is acceptable, where n=a real number). The angular displacement of the threaded sleeve 19, as well as of a turn knob 20 fixed onto the same and a scale 21 is directly proportional—through a forced coupling between a threaded spindle 18 formed on the rod 12 and the threaded sleeve 19—to the displacement of the rod 12 along the path 15, furthermore—due to the forced coupling described above—it is directly proportional to the change in the resonance-frequency of the cavity resonator, caused by the displacement of the tuning piston 3. As a consequence of the direct proportionality the scale 21 may be prepared with a linear frequency graduation, and for reading the same an index 22 may be used.

The factor of proportionality is defined by the mode-index of the cavity resonator (i.e. the quotient of the length of the cavity and the resonant wavelength), by the velocity of light, the pitch of the threaded spindle 18, the length of the arc of the scale 21, as well as the product of the distances measured from the axis 26 of the structural element 16 to the axles of rotation of the rollers 10, 11, respectively.

A holder 25 serves for the adjustment of the latter rolls shaped as a bearing of the axle of rotation 26, being able to move along a path 24 formed in a holder 27 and fixable in the same. Positioning of the tuning piston 3 in relation to the axle of rotation of the roller 10 takes place by displacing the rod 7 in a holder 5 in the direction of the longitudinal axis of the cavity, whereby the adjusted position is to be fixed by the screw 6. Part 45 will be described later (with reference to the details of Fig. 2).

By turning the scale 21 on the threaded sleeve 19 and fixing the same, the relative position of the axle of rotation of the roller 11 and the scale 21 can be adjusted. By the aid of the three adjusting elements mentioned above, the resonance frequency of the cavity resonator can be adjusted to a prescribed value at three different points, thus any frequency error, resulting from manufacturing tolerances of the structural tuning elements, is eliminated. With cavity resonators that operate with a pure TEM waveform, the adjustments described above yield a theoretical frequency error equalling zero along the entire tuning range. Besides, an exact linear connection can be achieved between the resonant frequency and the positions of the rod 12 and the scale 21, respectively.

A holder 14 serves for fixing the structural tuning elements to the cavity resonator as well for supporting the straight path of the rod 12. A loop 28 serves for coupling in and out electromagnetic signals from the cavity resonator.

Instead of this loop one or more coupling elements with an iris or a probe may be applied. Instead of the frequency scale formed on the turn knob, a scale with a digital reading, or with a number indicating disc, driven from the axle of the knob through a geared transmission can also be used.

FIG. 2 shows another cavity resonator in a longitudinal section according to the invention, operating with a TE or TM waveform. The spacer—consisting of the rods 4 and 7—is connected to the tuning piston 3 within the cavity 1 (most identical structural parts or elements were described in connection with FIG. 1). The displacement of the tuning piston 3 is forced onto the straight path—which is parallel with the longitudinal axis of the cavity—by the straight path 9 formed on a holder 8*a*, similar to 8 of FIG. 1. The displacement of the tuning piston 3 on that path is determined by an arrangement that the roller 10, fixed onto the rod 7, rolls along the guide path 15 formed on the rod 12, while a structural element 16*a* rotates around the axis 26, perpendicular to the plane of the drawing, together with the rod 12; on the other hand this rod performs a linear movement in relation to the structural element 16*a*, whereby the displacement is defined by a rolling movement along a second straight guide path 17, which is preferably perpendicular to the axis of the cavity resonator and is formed on a holder 14*a*, modified in comparison to holders 14 of FIGS. 1 and 3, the movement being performed by the roller 11 that is fixed—e.g. by the aid of a spacer 44—to the operating rod 12.

The forced coupling between the roll 10 and the guide path 15, and between the roller 11 and the second path 17, respectively, is ensured by the spring 29.

In the here described embodiment, the guide path 15 is formed not directly on the structural element 16*a* itself but on the rod 12. A path formed on the structural element itself would yield the same quality of tuning since the structural element 16*a* and the rod 12 rotate together around the axle 26. The linear displacement of the rod 12 in relation to the element 16*a* is performed by the spindle 18, rotatably arranged in the sleeve 19, provided with the straight-line path, whereas the turn knob 20 is fixed to the spindle 18.

In this embodiment the threaded sleeve 19 is formed on the rod 12 instead of the structural element connected to the turn knob 20, consequently the threaded spindle 18 is formed on the structural element 16*a* connected to the turn knob 20 instead of the rod 12. It goes without saying that the frequency-linear tuning according to the invention can be realized with an opposite arrangement of the spindle and the threaded nuts too.

The shafts of the rollers 10 and 11, as well as the axle of rotation 26 are arranged in a plane perpendicular to the plane of the drawing. In this case the linear displacement of the rod 12 in relation to the structural element 16 and consequently the angular displacement of the turn knob 20 is directly proportional to the resonance frequency of the cavity resonator. This means that the turn knob 20 may be provided with a frequency-linear scale 21*a;* reading of the scale takes place by the aid of the index 22. A pivot 32, moving in a notch and formed on the element 16*a* prevents rotation of the rod 12 in relation to the element 16*a*.

A further preliminary condition of the frequency linear tuning appears in that the distance measured between the axle of rotation 26 of the structural element 16*a* and the longitudinal axis of the cavity resonator be equal to the product of the half-wavelength that belongs to the mode of oscillation, i.e. waveform of the cavity resonator and of the mode index according to the longitudinal axis of the cavity (i.e. the number of field-strength half-periods occurring along the longitudinal axis), furthermore that the projection of the distance between the axles of rotation 26 and that of the roller 10, falling onto the longitudinal axis of the cavity resonator, be equal to the electric length of the cavity, i.e. to the distance between an end plate 45 of the cavity (see also in FIG. 1) and the piston 3. To ensure these conditions, the holder 25 is shaped so that its adjustment is possible in relation to the axis of the cavity whereas the adjusted position is fixed by the aid of a screw 30. Furthermore the rod 7 can be shifted within the rod 4, the position of the latter being fixed by the bolt 6.

The factor of proportionality of the frequency linear displacement of the rod 12 is defined by the boundary wavelength of the operative waveform of the cavity resonator, the velocity of light and the distance between the plane of the guide path 17 and the plane that passes through the center of the axis 26 and is perpendicular to the cavity axis. The latter can be adjusted by displacing the holder 14*a* parallel with the longitudinal cavity axis whereupon the position of that holder can be fixed by a screw 31. When determining the factor of proportionality of the scale division—besides what was mentioned above—the pitch of the spindle 18 and the scale arc length of the turn knob 20 can be calculated, too.

By positioning the rod 7, the axle of rotation 26, the holder 14*a*, as well as the scale 21*a* on the turn knob 20, the resonant frequency of the cavity resonator can be adjusted to a prescribed value at least at three different points of the operative range of the cavity resonator, thus eliminating frequency errors resulting from manufacturing tolerances of the cavity resonator and of the structural tuning elements.

With cavity resonators operating with a pure TE or pure TM waveform, by performing the adjustment described above, not only a frequency error theoretically equalling zero can be achieved within the entire tuning range, but also an exact linear relation between the position of the rod 12, i.e. the scale 21*a* connected to the same can be attained.

An iris 35—connecting a waveguide space 33 joined to an end plate 34 of the cavity and the cavity itself- —and the loop 28, respectively, serve for coupling in and out an electromagnetic signal from the cavity resonator. It goes without saying that instead of these units one or more other coupling elements may be applied.

Instead of the simplified solution—the scale **21*a* arranged on the turn knob 20—illustrated in FIG. 2**, a frequency scale with digital reading, driven preferably from the shaft of the turn knob by gears, can be used for reading the resonant frequency.

FIG. 3 shows a longitudinal section of an oscillator built up with a reflex klystron as an active circuit element, serving for the excitation of the oscillation, operating with the TEM basic waveform according to the invention. When describing this figure the description is restricted to the details that are different from the arrangement illustrated in FIG. 1.

In the inside of the inner conductor 2 of the cavity 1 a bore is provided partly for enabling a galvanic connection of one of several cavity grids 38 of a reflex klystron 36 to the terminal of the inner conductor 2, partly to be able to conduct an operative supply voltage to a reflector-electrode connection 39 of the reflex klystron within the internal conductor 2.

Another cavity grid 37 of the reflex klystron 36 is galvanically connected to the external conductor of the cavity. A voltage for the reflector of the reflex klystron, an accelerating voltage for a unit 40, a voltage for an electrode (grid or Wehnelt cylinder) of a beam current controller 41, as well as a heating voltage for a unit 42 are supplied by a suitable power unit 43.

As it is well known, the frequency of oscillation of the oscillator tuned by the cavity resonator is fundamentally defined by the resonant frequency of the cavity. The characteristics of the active circuit element—in this case the reflex klystron—exert a relatively small effect, thus the tuning characteristics of the oscillator illustrated in FIG. 3 are similar to that of the cavity resonator seen in FIG. 1, i.e. it is linear with a good approximation. A deviation from linearity is merely due to the contributory effect of the active circuit elements. This deviation—using the same adjusting element that serves for the elimination of differences resulting from manufacturing tolerances of the cavity resonator and the structural tuning elements—can be annulled at three different frequencies of the tuning range.

With the oscillator according to FIG. 3, positioning of the holder 25, the rod 7, as well as the scale 21, —besides playing a role that is identical with the function of the corresponding adjusting elements of the cavity resonator according to FIG. 1—they serve simultaneously for the approximation with three zero points to the contributory effect of the active circuit element.

Beside a few specifically mentioned parts, FIG. 3 also shows the elements 3 to 6, 8 to 16, 18 to 20, 22 to 24 and 26 to 29 that were fully described in connection with FIG. 1.

The signal generator according to the invention, operating with a TEM-waveform and tuned by the cavity resonator, differs from the oscillator illustrated in FIG. 3 in respect of level measuring, controlling and dividing circuits applied in the coupling circuits. Since the solutions of these circuits are well known, the description of details has been omitted.

In the oscillator according to FIG. 3 active circuit elements, semiconductors (f.i. Gunn diodes, IMPATT diodes, Baritt diodes, transistors, etc.) can be used instead of the reflex klystron 36. Furthermore, instead of the supply (43) and modulator units (40, 42) illustrated in FIG. 3, supply and modulator units are applied that serve for operating the semi-conductor circuit elements, thus producing an oscillator and a signal generator, respectively, having the same properties in respect of the frequency-linear tuning, as described in connection with FIG. 3.

What we claim is:

1. A cavity resonator with straight-line frequency tuning, operating in a TEM basic waveform, comprising: at least one tuning element connected to a cavity of the resonator and including at least one first structural element that insures linear guidance and is displaceable along a straight forced trajectory; said tuning element being in a forced coupling with a straight guide path that is formed on a second structural element that is swingable about a rotational axis that is perpendicular to the direction of straight movement of said tuning element, said tuning element being provided with a first roller that bears against said guide path; and a frequency-linear adjusting organ displaceable along another straight forced trajectory and being provided with a second roller that also bears against said guide path.

2. The cavity resonator as defined in claim 1, wherein said at least one first structural element includes spacers and at least one piston.

3. The cavity resonator as defined in claim 1, wherein at least one of said first and said second rollers is prestressed by a tension spring.

4. The cavity resonator as defined in claim 1, wherein said frequency-linear adjusting organ is in the form of a rod.

5. The cavity resonator as defined in claim 1, wherein the center of said rotational axis and the centers of rotation of said first and said second rollers all lie on the same straight line that is parallel with said straight guide path.

6. The cavity resonator as defined in claim 1, wherein the direction of straight movement of said frequency-linear adjusting organ includes an angle of 30° to 90° with the direction of straight movement of said tuning element.

7. The cavity resonator as defined in claim 1, wherein said frequency-linear adjusting organ is provided with a threaded spindle and an operatively connected threaded sleeve, further comprising a frequency scale joined to one of said spindle and said sleeve, and a turn knob for said scale.

8. The cavity resonator as defined in claim 1, wherein the center of rotation of said first roller is adjustable into the direction of straight movement of said tuning element in relation to the position of at least one tuning piston forming part of said at least one structural element.

9. The cavity resonator as defined in claim 1, wherein said rotational axis is embedded in a holder that can be positioned in relation to said cavity in a parallel plane defined by the directions of straight movement of said tuning element and of said frequency-linear adjusting organ (12).

10. The cavity resonator as defined in claim 1, wherein the center of rotation of said second roller is adjustable in relation to said frequency-linear adjusting organ.

11. The cavity resonator as defined in claim 1, wherein the resultant thermal expansion of components that define a distance between the center of said rotational axis and an end plate forming an electromagnetic cover for said cavity, measured in the direction of straight movement of said tuning element, which movement also constitutes a forced trajectory, equals the resultant thermal expansion of said tuning element, furthermore the coefficient of the resultant thermal expansion of said frequency-linear adjusting organ equals the sum of the coefficients of resultant thermal expansion of other components that define two distances, one of them being a distance between said rotational axis, measured perpendicularly, and a straight line parallel with the forced trajectory of said tuning element and passing through the center of rotation of said first roller, the other distance being a perpendicular distance between said rotational axis and a straight line parallel with the straight forced trajectory of said adjusting organ and passing through the center of rotation of said second roller.

12. A cavity oscillator comprising a cavity resonator as defined in claim 1, and a reflex klystron, resonator grids of said klystron being connected to inner and outer conductors of said resonator.

13. A cavity resonator with straight-line frequency tuning, operating in a TE or TM basic waveform, comprising: at least one tuning element connected to a cavity of the resonator and including at least one first structural element that insures linear guidance and is displaceable along a straight forced trajectory; said tuning element being in a forced coupling with a straight guide path that is formed on a frequency-linear adjusting organ which is included in a second structural tuning element and is swingable about a rotational axis that is perpendicular to the direction of straight movement of said tuning element, said tuning element being provided with a first roller that bears against said guide path; said adjusting organ being displaceable along another straight forced trajectory formed along said second structural tuning element and being provided with a second roller that bears against another straight guide path formed on a holder that is fixed to a wall of said cavity.

14. The cavity resonator as defined in claim 13, wherein said at least one first structural element includes spacers and at least one piston.

15. The cavity resonator as defined in claim 13, wherein said first roller is prestressed by a tension spring.

16. The cavity resonator as defined in claim 13, wherein the center of said rotational axis and the centers of rotation of said first and said second rollers all lie on the same straight line that is parallel with said first-named straight guide path.

17. The cavity resonator as defined in claim 13, wherein said frequency-linear adjusting organ is provided with a threaded spindle and an operatively connected threaded sleeve, further comprising a frequency scale joined to one of said spindle and said sleeve, and a turn knob for said scale, connected to said spindle.

18. The cavity resonator as defined in claim 13, wherein the center of rotation of said first roller is adjustable into the direction of straight movement of said tuning element in relation to the position of at least one tuning piston forming part of said at least one structural element.

19. The cavity resonator as defined in claim 13, wherein said rotational axis is embedded in a holder that can be positioned in relation to said cavity in a parallel plane defined by the directions of straight movement of said tuning element and of said frequency-linear adjusting organ.

20. The cavity resonator as defined in claim 13, wherein the center of rotation of said second roller is adjustable in relation to said frequency-linear adjusting member.

21. The cavity resonator as defined in claim 13, wherein the direction of said other straight guide path is perpendicular to the direction of straight movement of said tuning element.

22. The cavity resonator as defined in claim 13, wherein the resultant thermal expansion of components that define a distance between the center of said rotational axis and an end plate forming an electromagnetic cover for said cavity, measured along the straight movement of said tuning element, which movement also constitutes a forced trajectory, equals the resultant thermal expansion of said tuning element, furthermore the coefficient of the thermal expansion of said cavity equals the coefficient of thermal expansion of other components that define a distance, measured perpendicularly, between said rotational axis and a straight line parallel with the forced trajectory of said tuning element and passing through the center of rotation of said first roll, furthermore the resultant coefficient of the thermal expansion of further components that define a distance between said rotational axis and the axis of rotation of said second roller equals the coefficient of thermal expansion of said cavity, and the coefficient of the resultant thermal expansion of yet other components that define a distance between a straight line that is perpendicular to the forced trajectory of said tuning element and passing through said rotational axis and a straight line that is perpendicular to the forced forced trajectory of said tuning element and passing through the axis of rotation of said second roller.

* * * * *